United States Patent [19]

Morikawa

[11] Patent Number: 4,839,304
[45] Date of Patent: Jun. 13, 1989

[54] METHOD OF MAKING A FIELD EFFECT TRANSISTOR WITH OVERLAY GATE STRUCTURE

[75] Inventor: Hiroshi Morikawa, Tokyo, Japan
[73] Assignee: NEC Corporation, Tokyo, Japan
[21] Appl. No.: 134,123
[22] Filed: Dec. 17, 1987

[30] Foreign Application Priority Data

Dec. 18, 1986 [JP] Japan ................. 61-303104

[51] Int. Cl.$^4$ .............. H01L 21/265; H01L 21/44
[52] U.S. Cl. ........................... 437/39; 437/29; 437/49; 437/175; 437/176; 437/177; 437/179; 437/245; 437/912; 148/DIG. 143
[58] Field of Search ............ 437/39, 228, 184, 185, 437/175, 176, 177, 245, 29, 40, 49, 56, 58, 59, 249, 912; 357/15, 41, 22 I, 22 J, 22 K; 148/DIG. 143

[56] References Cited

U.S. PATENT DOCUMENTS

| | | | |
|---|---|---|---|
| 4,518,629 | 5/1985 | Jeuch | 437/228 |
| 4,546,540 | 10/1985 | Ueyamagi et al. | 437/39 |
| 4,551,905 | 9/1985 | Chao et al. | 437/176 |
| 4,599,790 | 7/1986 | Kim et al. | 437/184 |
| 4,670,090 | 6/1987 | Sheng et al. | 437/249 |
| 4,694,564 | 9/1987 | Emoki et al. | 437/175 |
| 4,700,462 | 10/1987 | Beaubiem et al. | 437/187 |
| 4,735,913 | 4/1988 | Hayes | 437/39 |
| 4,774,206 | 9/1988 | Willer | 437/176 |

FOREIGN PATENT DOCUMENTS

| | | | |
|---|---|---|---|
| 0057558 | 8/1982 | European Pat. Off. | 437/39 |
| 0133876 | 10/1981 | Japan | 437/39 |
| 0117172 | 7/1984 | Japan | 437/39 |
| 0135773 | 8/1984 | Japan | 437/39 |
| 0261179 | 12/1985 | Japan | 437/39 |

Primary Examiner—Brian E. Hearn
Assistant Examiner—Tom Thomas
Attorney, Agent, or Firm—Sughrue, Mion, Zinn, Macpeak & Seas

[57] ABSTRACT

For reduction in parasitic capacitance of a overlay gate structure, there is disclosed a process of fabricating a MES type field effect transistor comprising the steps of (a) preparing a semi-insulating substrate with a surface having a gate forming area and a remaining area, (b) forming a gate electrode on the gate forming area of the surface of the semi-insulating substrate, the gate electrode having an upper surface and side walls, (c) forming a protection film on the upper surface and the side walls of the gate electrode and the remaining area of the surface of the semi-insulating substrate, (d) covering the protection film with a material which is different in etching rate from the protection film, (e) forming a filling layer of the material for creating a generally smooth topography by removing a part of the material over the gate electrode and a part of the protection film on the upper surface of the gate electrode, the filling layer having an upper surface substantially coplanar to the upper surface of the gate electrode, (f) forming a conductive layer on the upper surface of the gate electrode and the upper surface of the filling layer, and (g) removing the filling layer so as to cause the conductive layer to be spaced from a part of the protection film on the remaining area of the surface of the semi-insulating layer, so that the conductive layer does not contact with the filling layer, typically an insulating material.

11 Claims, 4 Drawing Sheets

PRIOR-ART

PRIOR-ART

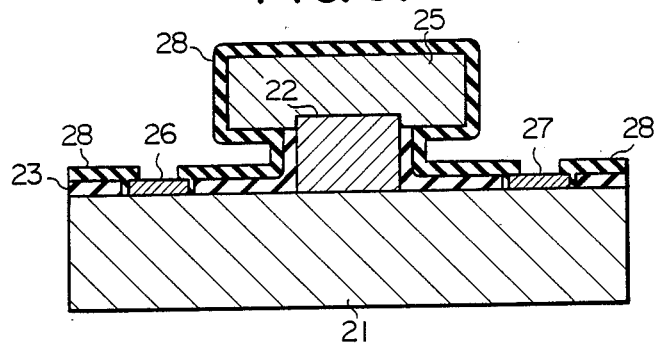
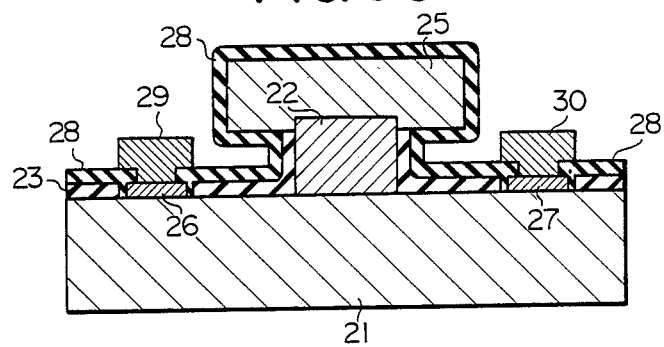

METHOD OF MAKING A FIELD EFFECT TRANSISTOR WITH OVERLAY GATE STRUCTURE

FIELD OF THE INVENTION

This invention relates to a field effect transistor and, more particularly, to a MES type field effect transistor with an overlay gate structure.

BACKGROUND OF THE INVENTION

In general, when a field effect transistor is designed to operate at a high frequency, the gate electrode of the field effect transistor tends to be shrunk in length. This results in that a signal on the gate electrode is subjected to a large resistance during propagation. One well known solution is the use of a overlay type gate electrode which has a T-shaped configuration. A typical example of a MES type field effect transistor with the overlay type gate electrode is illustrated in FIG. 1 of the drawings. In FIG. 1, reference numeral 1 designates a gallium-arsenide semi-insulating substrate and a gate electrode 2 of a tungsten silicide (WSi) is formed on the upper surface of the semi-insulating substrate 1. The upper surface of the semi-insulating substrate has an exposed area on the both sides of the gate electrode 2, and the exposed area is covered with an oxide layer 3. On the gate electrode 2 is formed a multiple metal layer 4 which is longer in length than the gate electrode 2, so that the multiple metal layer 4 has an outer peripheral portion 5 projecting from the outer peripheral of the gate electrode 2. In this prior-art example, the multiple metal layer 4 has a titanium film, a platinum film and an aurum film.

The process of fabricating the MES type field effect transistor illustrated in FIG. 1 starts with preparation of the gallium-arsenide semi-insulating substrate 1, and the gate electrode 2 is formed by a deposition of tungsten silicide followed by a lithography techniques. After formation of the gate electrode 2, the oxide layer 3 is formed on the exposed area of the semi-insulating substrate 1 so as to create a smooth topography and, thereafter, the multiple metal layer 4 is deposited and etched to form the overlay gate structure.

The MES type field effect transistor illustrated in FIG. 1 has the gate structure with a low resistance by virtue of the multiple metal layer 4, however a problem is encountered in a large parasitic capacitance due to direct contact with the oxide layer 3.

In order to reduce the parasitic capacitance encountered in the MES type field effect transistor illustrated in FIG. 1 of the drawings, another MES type field effect transistor is proposed, and the structure thereof is illustrated in FIG. 2 of the drawings. Referring now to FIG. 2 of the drawings, the MES type field effect transistor illustrated in FIG. 2 comprises a semi-insulating substrate 11, a gate electrode 12 formed on the upper surface of the semi-insulating substrate 11, a conductive metal layer 13 provided on the gate electrode 12, and a thin insulating film 14. The metal layer 13 is longer in length than the gate electrode 12 so that the metal layer 13 has an outer peripheral portion 15 projecting from the outer peripheral of the gate electrode 12. Most of the upper surface of the semi-insulating substrate 11 is covered with the thin insulating layer 14, however the semi-insulating substrate 11 has an exposed portion under the metal layer 15 because of the outer peripheral portion 15 of the metal layer 15. This is because of the fact that the thin insulating layer 14 is deposited on the upper surface of the semi-insulating substrate 11 after formation of the conductive metal layer 13. Namely, the process of fabrication starts with preparation of the semi-insulating substrate 11, and the gate electrode 12 is formed on the semi-insulating substrate 11. After the gate electrode 12 is formed on the upper surface of the semi-insulating substrate 11, an oxide film (not shown) is deposited to create a smooth topography. The formation of the conductive metal layer 13 follows, and, thereafter, the oxide film is etched away to expose the upper surface of the semi-insulating substrate 11. When the upper surface of the semi-insulating substrate 11 is exposed, the thin insulating film 14 is deposited on the exposed upper surface of the semi-insulating substrate 11 for protection. However, the metal layer with the outer peripheral portion 15 has been already formed on the gate electrode 12, so that the thin insulating film 14 hardly covers the entire exposed upper surface under the outer peripheral portion 15. This results in that the MES type field effect transistor illustrated in FIG. 2 has an exposed area under the outer peripheral portion 15 of the metal layer 13 even if the thin insulating film 14 is applied to the upper surface of the semi-insulating substrate 11. For this reason, the MES structure illustrated in FIG. 2 is free from the large parasitic capacitance, however another problem is encountered in the MES structure illustrated in FIG. 2 in incomplete protection film of the upper surface of the semi-insulating substrate 11.

SUMMARY OF THE INVENTION

It is therefore an important object of the present invention to provide a field effect transistor with a overlay gate structure which is free from the large parasitic capacitance.

It is another important object of the present invention to provide a field effect transistor the surface of which is perfectly covered with a protection film.

It is still another important object of the present invention to provide a process of fabricating a field effect transistor with a overlay gate structure which is free from the problems in the prior-art field effect transistors.

To accomplish these objects, the present invention proposes to cover an exposed area of the upper surface of the substrate with a protection film formed before formation of a thick filling layer for creating a smooth topography.

In accordance with one aspect of the present invention, there is provided a metal-semiconductor type field effect transistor comprising, (a) a semi-insulating substrate with a surface having a gate forming area and a remaining area, (b) a gate electrode formed on the gate forming area of the surface of the semi-insulating substrate and having side wall, (c) a protection film formed on the side walls of the gate electrode and the remaining area of the surface of the semi-insulating substrate, and (d) a conductive layer formed on the gate electrode and having an outer peripheral portion projecting from an outer peripheral of the gate electrode. The semi-insulating substrate may be formed of a gallium-arsenide compound semiconductor, and the gate electrode may be formed of a tungsten silicide. In an implementation, the protection film is formed by a silicon nitride film with a thickness of about 1000 angstroms, and the conductive layer has a multiple metal structure formed of titanium, platinum and aurum. The multiple structure may have three metal films formed of titanium, platinum and aurum, respectively, and having thicknesses of about 500 angstroms, 200 angstroms and 400 angstroms, respectively.

In accordance with another aspect of the present invention, there is provided a process of fabricating a metal-semiconductor type field effect transistor comprising the steps of (a) preparing a semi-insulating substrate with a surface having a gate forming area and a remaining area, (b) forming a gate electrode on the gate forming area of the surface of the semi-insulating substrate, the gate electrode having an upper surface and side walls, (c) forming a protection film on the upper surface and the side walls of the gate electrode and the remaining area of the surface of the semi-insulating substrate, (d) covering the protection film with a material which is different in etching rate from the protection film, (e) forming a filling layer of the material for creating a generally smooth topography by removing a part of the material over the gate electrode and a part of the protection film on the upper surface of the gate electrode, the filling layer having an upper surface substantially coplanar to the upper surface of the gate electrode, (f) forming a conductive layer on the upper surface of the gate electrode and the upper surface of the filling layer, and (g) removing the filling layer so as to cause the conductive layer to be spaced from a part of the protection film on the remaining area of the surface of the semi-insulating layer. In an embodiment, the protection film is formed by a silicon nitride film deposited by using a plasma-assisted chemical vapor deposition technique, and the protection film is covered with the material by a spin coating technique using a silicon oxide in solution. The silicon oxide may be dissolved in an organic solvent. In the embodiment, the generally smooth topography is created by a dry etching technique using a $CF_4$-containing gaseous mixture. For spacing the conductive layer from the protection film on the semi-insulating substrate, the filling layer may be removed by a wet etching technique using an etching solution containing hydrofluoric acid, and the etching solution may contain hydrofluoric acid diluted with water so as to have a hydrofluoric-acid/water ratio about 1:30. In another embodiment, the protection film is formed by a silicon nitride film deposited by a photoexcited chemical vapor deposition technique, and the material is formed of polymide resin. The polymide resin may be partially removed by a dry etching technique using a $CF_4$—$O_2$ gaseous mixture, and, thereafter, the protection film of silicon nitride may be partially removed by a dry etching technique using a $CF_4$ etching gas, thereby forming the filling layer. The polymide resin may be removed in an oxygen plasma so as to space the conductive layer from the protection film on the semi-insulating substrate.

BRIEF DESCRIPTION OF THE DRAWINGS

The features and advantages of a metal-semiconductor field effect transistor and a process of fabrication thereof according to the present invention will be more clearly understood from the following description taken in conjunction with the accompanying drawings in which:

FIGS. 3A to 3G are cross sectional views showing a series of process steps for fabricating a MES type field effect transistor with a overlay gate structure according to the present invention.

DESCRIPTION OF THE PREFERRED EMBODIMENTS

Figure 1:
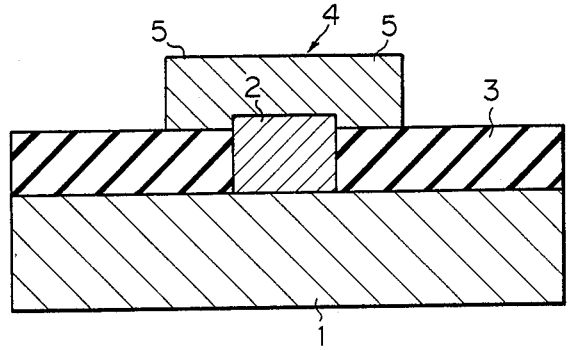
FIG. 1 is a cross sectional view showing the structure of a prior-art MES type field effect transistor with a overlay gate structure.
Figure 2:
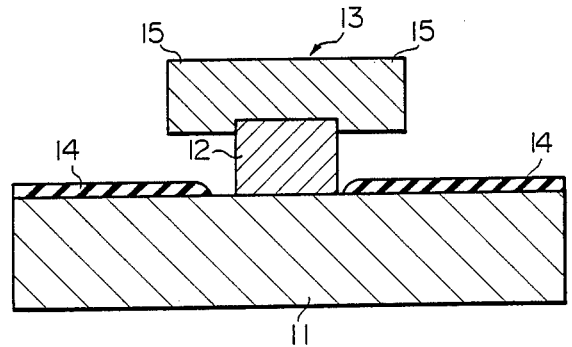
FIG. 2 is a cross sectional view showing the structure of another prior-art MES type field effect transistor with a overlay gate structure which is proposed to overcome the problem encountered in the MES type field effect transistor illustrated in FIG. 1.
Figure 3A:
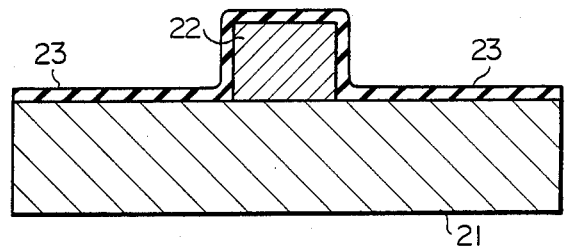

Referring to FIGS. 3A to 3G of the drawings, a process sequence of fabricating a MES (metal-semiconductor) type field effect transistor according to the present invention is illustrated. The starting material is a gallium-arsenide (GaAs) semi-insulating substrate 21, and tungsten silicide (WSi) is deposited on a surface of the semi-insulating substrate 21 by using, for example, a sputtering technique. When the tungsten silicide layer (not shown) is deposited to a thickness of about 5000 angstroms, a mask is applied thereon and, then, the tungsten silicide layer is partially removed by an etching process. Then, a gate electrode 22 is formed on the semi-insulating substrate 21, and, upon completion of the gate electrode 22, an exposed area extends on the both sides of the gate electrode 22. After formation of the gate electrode 22, silicon nitride is deposited on the entire surface of the resultant structure, namely an upper surface and side walls of the gate electrode 22 and the exposed area of the semi-insulating substrate 21, to a thickness of about 1000 angstroms by a plasma-assisted chemical vapor deposition technique, then a protection film 23 is provided on the gate electrode 22 and the exposed area of the semi-insulating substrate 21. The resultant structure is illustrated in FIG. 3A.

Upon completion of the protection film 23 of silicon nitride, a solution of a silicon oxide is spun onto the resultant structure shown in FIG. 3A, so that the resultant structure is covered with the silicon oxide. In this instance, the silicon oxide dissolved in an organic solvent is used. When the silicon oxide sufficiently covers the gate electrode 22 and the exposed area of the semi-insulating substrate 21, the silicon oxide is partially removed by a dry etching technique using a $CF_4$—(tetrafluoric carbon)-containing gaseous mixture to exposed the protection film 23 on the upper surface of the gate electrode 22. The $CF_4$-containing gaseous mixture also etches the silicon nitride, so that the protection film 23 on the upper surface of the gate electrode 22 is then removed to expose the upper surface of the gate electrode 22. In this way, a filling layer 24 is formed on the protection film 23. When the upper surface of the gate electrode 22 is exposed, a generally smooth topography is created as will be seen from FIG. 3B. In other words, the filling layer 24 has an upper surface substantially coplanar to the upper surface of the gate electrode 22.

Figure 3B:
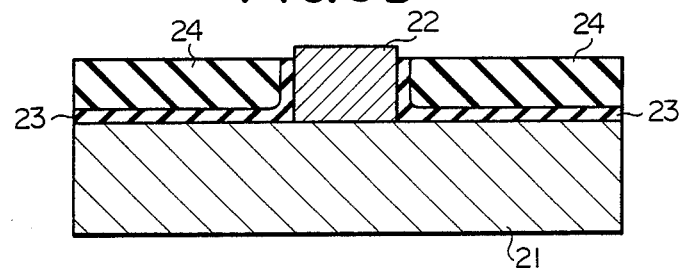

Subsequently, a multiple metal structure is formed on the entire surface of the resultant structure shown in FIG. 3B. Namely, titanium, platinum and aurum are deposited in succession by using sputtering techniques. The titanium film, the platinum film and the aurum film have thicknesses of about 500 angstroms, 200 angstroms and 400 angstroms, respectively, and, then, a photoresist mask is applied on the multiple metal structure. With the photoresist mask, the multiple metal structure is partially removed by using an ion milling technique to form a conductive layer 25 which has a length L1 longer then the length L2 of the gate electrode 22 as will be better seen from FIG. 3C. Thus, the MES type field effect transistor has a gate structure consisting of the gate electrode 22 combined with the conductive layer 25, so that the resistance of the gate structure is relatively small in value. This results in that the gate structure can propagate an electric signal without any delay.

Figure 3C:
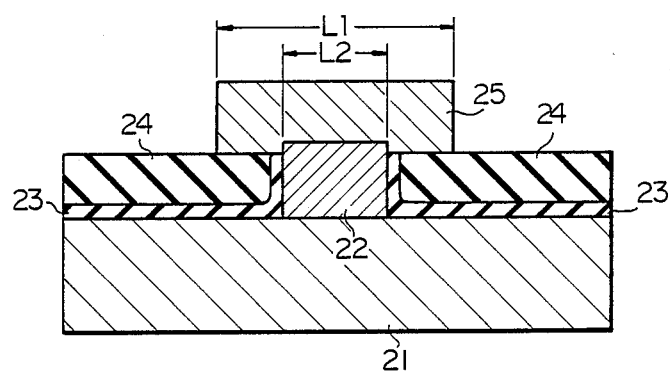
Figure 3D:
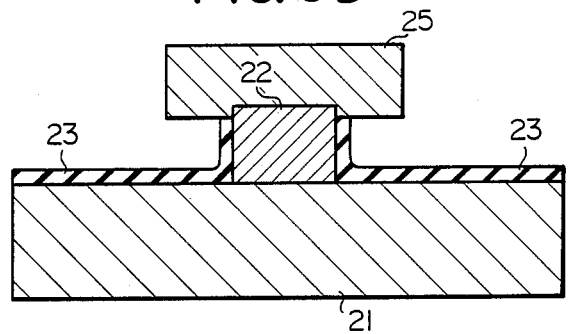

After formation of the gate structure, the filling layer 24 is removed to expose the protection film 23 by a wet etching technique. Namely, the resultant structure shown in FIG. 3C is dipped into an etching solution containing hydrofluoric acid (HF) for several seconds. The hydrofluoric acid is diluted with water, and, in this instance, the hydrofluoric acid and the water is in the ratio 1:30. Thus, the filling layer 24 of the silicon oxide is etched away, and the conductive layer 25 is spaced from the protection film 23 which extends on the surface of the semi-insulating substrate. The protection film 23 perfectly covers the surface of the semi-insulating substrate 21 and the side walls of the gate electrode 22. For this reason, the parasitic capacitance is drastically reduced and the electric signal on the gate structure is not affected by a time constant CR. Moreover, the surface of the semi-insulating substrate 21 is perfectly covered with the protection film 23, so that the MES type field effect transistor can operate in stable. The MES type field effect transistor with the overlay gate structure is illustrated in FIG. 3D.

Figure 3E:
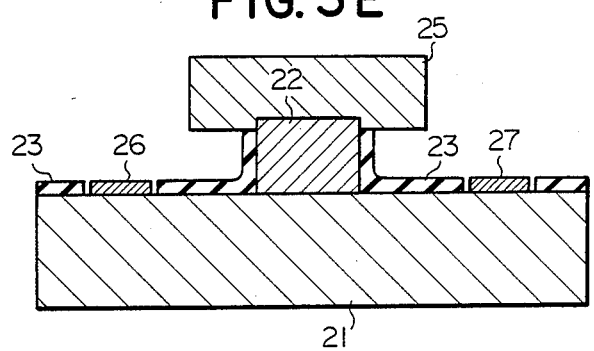

After formation of the gate structure, the protection film 23 is partialy removed to form source and drain contact windows by using a lithographic technique, and, thereafter, ohmic electrodes of an Au-Ge-Ni alloy are formed in the source and drain contact windows as will be seen from FIG. 3E.

Subsequently, an oxide film 28 of about 1000 angstroms is formed on the entire surface of the resultant structure shown in FIG. 3E, and the oxide film 28 is partially etched away to expose the top surfaces of the ohmic electrodes 26 and 27 by using a photo-resist mask. The resultant structure is illustrated in FIG. 3F of the drawings.

On the entire surface of the resultant structure shown in FIG. 3F are subsequently deposited titanium and aurum to thicknesses of about 500 angstroms and 2000 angstroms, respectively, by sputtering techniques. Using the multiple-layer consisting of the titanium film and aurum film as a conduction path, source and drain electrodes 29 and 30 are grown on the ohmic electrodes 26 and 27, respectively, by an electroplating technique using a photo-resist film as a mask. When each of the source and drain electrodes 29 and 30 is grown to a thickness of 2 microns, the photo-resist film is stripped off and, thereafter, the multiple-layer consisting of the titanium film and the arum film is removed by an ion milling (see FIG. 3G).

In the embodiment hereinbefore described, the protection film and the filling layer are formed by the silicon nitride film deposited by the plasma-assisted chemical vapor deposition technique and the silicon oxide film, however a silicon nitride film ($Si_3 N_4$) deposited by a photo-excited chemical vapor deposition technique and a polymide resin film are available for forming the protection film and the filling layer, respectively. In this example, a gaseous mixture of $CF_4$ and $O_2$ is used for the etching process for forming the filling layer. In detail, after forming the polymide resin film, the protection film of silicon nitride on the upper surface of the gate electrode is exposed by the etching process using the $CF_4$—$O_2$ gaseous mixture, and, thereafter, the upper surface of the gate electrode is exposed by changing the etching gas from the $CF_4$—$O_2$ gaseous mixture to a $CF_4$ gas. In the separation step of the conductive layer, the polymide resin is removed in an oxygen ($O_2$) plasma. When the protection film is formed by the silicon nitride film deposited by the photo-exited chemical vapor deposition as described hereinbefore, the surface of the semi-insulating substrate is less damaged in comparison with that covered with the silicon nitride film deposited by the plasma-assisted chemical vapor deposition. However, the silicon nitride film deposited by the photo-excited chemical vapor deposition is liable to be corroded by the etching solution containing the hydrofluric acid (HF), so that it is preferable to use the polymide resin film as the filling layer which can be removed by using the oxygen plasma.

Although particular embodiment of the present invention have been shown and described, it will be obvious to those skilled in the art that various changes and modifications may be made without departing from the spirit and scope of the present invention.

What is claimed is:

1. A process of fabricating a metal-semiconductor type field effect transistor, comprising the steps of:
   (a) preparing s semi-insulating substrate with a surface having a gate forming area and a remaining area;
   (b) forming a gate electrode on the gate forming area of the surface of said semi-insulating substrate, said gate electrode having an upper surface and side walls;
   (c) forming a protection film on the upper surface and the side walls of said gate electrode and the remaining area of the surface of said semi-insulating substrate;
   (d) covering said protection film with a material which is different in etching rate from said protection film;
   (e) forming a filling layer of said material for creating a generally smooth topography by removing a part of said material over said gate electrode and a part of said protection film on the upper surface of said gate electrode, said filling layer having an upper surface substantially coplanar to the upper surface of said gate electrode;
   (f) forming a conductive layer on the upper surface of said gate electrode and the upper surface of said filling layer; and
   (g) removing said filling layer so as to cause said conductive layer to be spaced from a part of said protection film on the remaining area of the surface of said semi-insulating layer.

2. A process of fabricating a metal-semiconductor field effect transistor as set forth in claim 1, in which said protection film is formed by a silicon nitride film deposited by using a plasma-assisted chemical vapor deposition technique.

3. A process of fabricating a metal-semiconductor field effect transistor as set forth in claim 2, in which said protection film is covered with said material by a spin coating technique using a silicon oxide in solution.

4. A process of fabricating a metal-semiconductor field effect transistor as set forth in claim 3, in which said silicon oxide is dissolved in an organic solvent.

5. A process of fabricating a metal-semiconductor field effect transistor as set forth in claim 3, in which said generally smooth topography is created by a dry etching technique using a CF$_4$-containing gaseous mixture.

6. A process of fabricating a metal-semiconductor field effect transistor as set forth in claim 3, in which said filling layer is removed by a wet etching technique using an etching solution containing hydrofluoric acid, thereby causing said conductive layer to be spaced from a part of said protection film on the remaining area of the surface of said semi-insulating substrate.

7. A process of fabricating a metal-semiconductor field effect transistor as set forth in claim 6, in which said etching solution contains hydrofluoric acid diluted with water so as to have a hydrofluoric-acid /water ratio about 1:30.

8. A process of fabricating a metal-semiconductor field effect transistor as set forth in claim 1, in which said protection film is formed by a silicon nitride film deposited by a photo-excited chemical vapor deposition technique.

9. A process of fabricating a metal-semiconductor field effect transistor as set forth in claim 8, in which said material is formed of polymide resin.

10. A process of fabricating a metal-semiconductor field effect transistor as set forth in claim 9, in which said polymide resin is partially removed by a dry etching technique using a CF$_4$—O$_2$ gaseous mixture, and, thereafter, said protection film of silicon nitride is partially removed by a dry etching technique using a CF$_4$ etching gas, thereby forming said filling layer.

11. A process of fabricating a metal-semiconductor field effect transistor as set forth in claim 9, in which said polymide resin is removed in an oxygen plasma, thereby causing said conductive layer to be spaced from a part of said protection film on the remaining area of the surface of said semi-insulating substrate.

* * * * *